(12) United States Patent
Doumoto et al.

(10) Patent No.: US 6,502,511 B1
(45) Date of Patent: Jan. 7, 2003

(54) PRINTING PLATE PROCESSING APPARATUS AND METHOD OF DETECTING THE LOCATION OF A REGISTER MARK ON A PRINTING PLATE

(75) Inventors: Hideki Doumoto, Fuchu (JP); Yuuki Watanabe, Tokyo (JP)

(73) Assignees: Ryobi LTD, Hiroshima-ken (JP); Kamo Corporation, Tokyo (JP)

( * ) Notice: Subject to any disclaimer, the term of this patent is extended or adjusted under 35 U.S.C. 154(b) by 0 days.

(21) Appl. No.: 09/552,166

(22) Filed: Apr. 18, 2000

(30) Foreign Application Priority Data

Apr. 19, 1999 (JP) .......................................... 11-111192
Mar. 9, 2000 (JP) ..................................... 2000-064782

(51) Int. Cl.⁷ .................................................. B41L 3/02
(52) U.S. Cl. ............................... 101/486; 101/DIG. 36; 33/617
(58) Field of Search ............................... 101/485, 486, 101/211, 248, 181, 183, DIG. 36; 33/614, 617, 620, 621

(56) References Cited

U.S. PATENT DOCUMENTS

| 4,484,522 A | * | 11/1984 | Simeth .......................... 101/181 |
| 4,489,652 A | * | 12/1984 | Takeuchi et al. ............. 101/181 |
| 4,553,478 A | * | 11/1985 | Greiner et al. ............... 101/181 |
| 5,850,789 A | * | 12/1998 | Rudolf et al. ................ 101/486 |
| 5,987,949 A | * | 11/1999 | Palmatier et al. ............ 72/17.3 |
| 6,101,945 A | * | 8/2000 | Hara et al. .................... 101/485 |
| 6,244,183 B1 | * | 6/2001 | Haney et al. ................. 101/129 |
| 6,257,141 B1 | * | 7/2001 | Hashimoto et al. .......... 101/477 |

FOREIGN PATENT DOCUMENTS

| DE | 42 28 904 | | 8/1992 |
| JP | 7043914 | * | 2/1995 |
| JP | 11143086 | * | 5/1999 |

* cited by examiner

*Primary Examiner*—Ren Yan
(74) *Attorney, Agent, or Firm*—Perkins Coie LLP

(57) ABSTRACT

The present invention provides a method of detecting the locations of right and left register marks respectively burned onto right- and left-hand side portions of a printing plate based upon image data of images respectively captured within an image processing area with right and left vertical edges respectively extending in the Y-direction, and upper and lower horizontal edges extending in the X-direction. The method includes detecting the center coordinates in the X-direction of the right and left register marks based upon the image data obtained from substantially the entire portion of the image data processing area; detecting the center coordinate in the Y-direction of the right register mark based upon the image data obtained from a right-hand side portion of the image data processing area extending up to at least the center coordinate in the X-direction of the right register mark; and detecting the center coordinate in the Y-direction of the left register mark based upon the image data obtained from a left-hand side portion of the image data processing area extending up to at least the center coordinate in the X-direction of the left register mark.

4 Claims, 11 Drawing Sheets

PRINTING PLATE PROCESSING APPARATUS AND METHOD OF DETECTING THE LOCATION OF A REGISTER MARK ON A PRINTING PLATE

BACKGROUND OF THE INVENTION

1. Field of the Invention

The present invention relates to a printing plate processing apparatus that is capable of detecting center coordinates of register marks burned onto a printing plate based upon binary image data of the image captured by a CCD camera or the like, and a method of detecting the locations of the register marks.

2. Discussion of the Background

A method of detecting register marks performed by a conventional printing plate processing apparatus will be described with reference to FIGS. 9 to 11. FIG. 9 is a flow chart showing the steps of detecting the location of right and left register marks respectively burned onto a printing plate. FIGS. 10A and 10B respectively illustrate binary image data representing a white register mark in a black background, and a histogram curve obtained through the scanning of the binary image data of FIG. 10A and the calculation of a gray level histogram for each scanning line. FIGS. 11A and 11B respectively illustrate binary image data representing a black register mark in a white background, and a histogram curve obtained through the scanning of the binary image data of FIG. 11A and the calculation of a gray level histogram for each scanning line.

To detect the location of each register mark on the printing plate, the following conditions should be met:

1. An essential portion of the register mark is substantially equal in shape to a cruciform configuration.
2. The register mark has a negligible inclination with regard to the scanning direction.
3. Any contamination, patterns or other foreign matters with high contrast, which may confuse image recognition of the register mark, do not exist around the register mark.
4. The register mark has optical characteristics, enabling the register mark to be adequately captured within the image processing area of a corresponding CCD camera etc.

In the above requirements, the cruciform configuration includes T-configuration, and other forms which has at least two lines crossing each other to indicate the center coordinate of the register mark.

The image of each register mark captured by a corresponding CCD camera is displayed within the image processing area with vertical edges and horizontal edges, as illustrated in FIG. 10A. Based upon the binary image data of the register mark, a corner of a left edge and a lower edge is selected as the origin (0, 0), and the abscissa axis and the ordinate axis are respectively selected as X-axis and Y-axis. The binary image data of the register mark are scanned in the Y-direction for each pixel line with each pixel at a point (Y=0) as a starting point for the scan of each pixel line. The gray level histogram or white level of each pixel in each scanning line is then calculated ($S_1$). Based upon the result of the calculation, a graph is made with the ordinate axis representing the white level and the abscissa axis as the representing the range of the image processing area ($S_2$), thereby obtaining a histogram curve, as illustrated in FIG. 10B.

In FIG. 10B, A, B, C and D respectively represent the vertical line showing the maximum value of the white level, the maximum value of the white level, the vertical line showing the minimum value of the white level and the minimum value of the white level. The average value E of the sum of all the vertical lines are then calculated ($S_3$).

The difference R between the maximum value B and the average value E, is compared with the difference L between the minimum value D and the average value E to determine which difference is larger than the other ($S_4$). When L<R, it is regarded as a white register mark in a black background ($S_5$). When L>R, it is regarded as a black register mark in a white background ($S_6$).

In case of L<R, i.e., the white register mark in the black background, the slice level is obtained by the formula: (Maximum value B+Average value E)/2, and the comparison between the sum of the white level for each scanning line and the slice level proceeds in the right and left directions with an A-line as a starting line to determine G- and H-lines, where the sum of the white level of one scanning line becomes the same level as the slice level ($S_7$). The line obtained by the formula: (G+H)/2 is then regarded as the center in the X-direction ($S_8$).

When the G- and H-lines cannot be detected, the A-line is regarded as the center in the X-direction of the register mark ($S_9$).

To obtain the center coordinate in the Y-direction of the white register mark, the scanning proceeds in the X-direction with each pixel at a point (X=0) as a starting point for the scan of each pixel line and with the corner of the left edge and the lower edge as the origin (0, 0), and the gray level histogram or white level of each pixel in each scanning line is then calculated in accordance with the flow of the step ($S_1$) to the step ($S_9$) to determine the center coordinate, in the same manner as the above.

In case of L>R, i.e., the black register mark in the white background, the slice level is obtained by the formula: (Minimum value D+Average value E)/2, and the comparison between the sum of the white level for each scanning line and the slice level proceeds in the right and left directions with a C-line as a starting line to determine I- and J-lines, where the sum of the white level of one scanning line becomes the same level as the slice level ($S_7$). The line obtained by the formula (I+J)/2 is regarded as the center in the X-direction ($S_8$).

When the I- and J-lines cannot be detected, the C-line is regarded as the center in the X-direction of the register mark ($S_9$).

Then, to obtain the center coordinate in the Y-direction of the black register mark, the gray level histogram or white level of each pixel in each scanning line in the X-direction is calculated in accordance with the flow of the step ($S_1$) to the step ($S_9$), in the same manner as the above.

According to the method of detecting the location of the register mark as described above, since the detection of the register mark is detected based upon the gray level histogram of all the pixels within the image processing area with the corner of the left and lower edges as the origin (0, 0), it may take a longer period of time to detect the center coordinate.

When the register mark is positioned in the proximity of the printing image, the gray level histogram of the printing image is included in the gray level histogram of the X- and Y-directions obtained by the calculation of the binary image data within the image processing area. The result is the inclusion of a large error in the gray level histogram given through the calculation of the binary image data within the image-processing area, posing a problem of not being able to detect an exact location of the center coordinate of the register mark in prompt and exact manner.

In consideration of the above problem, it is an object of the present invention to provide a printing plate processing apparatus and a method of detecting the location of the register marks burned onto a printing plate, which are capable of detecting the exact locations of the center coordinates of the register marks, even if both the register mark and the printing image exist within the same image processing area.

SUMMARY OF THE INVENTION

To achieve the above objects, there is provided a method of detecting the locations of right and left register marks respectively burned onto right- and left-hand side portions of a printing plate based upon image data of images respectively captured within an image processing area with right and left vertical edges respectively extending in the Y-direction, and upper and lower horizontal edges extending in the X-direction. The method includes detecting the center coordinate in the X-direction of the right register mark based upon the image data obtained from substantially the entire portion of the image data processing area; detecting the center coordinate in the Y-direction of the right register mark based upon the image data obtained from a right-hand side portion of the image data processing area extending up to at least the center coordinate in the X-direction of the right register mark; detecting the center coordinate in the X-direction of the left register mark based upon the image data obtained from substantially the entire portion of the image data processing area; and detecting the center coordinate in the Y-direction of the left register mark based upon the image data obtained from a left-hand side portion of the image data processing area extending up to at least the center coordinate in the X-direction of the left register mark.

In accordance with the above method, the center coordinate of each of the register marks can be exactly detected, even if a print image is located in a right-hand side portion of the left register mark, or in a left-hand side portion of the right register mark.

The above method of the present invention may further includes determining if the right register mark is white or black by using a white level of the first several pixel lines from the right edge of the image processing area, and if the left register mark is white or black by using the white level of the first several pixel lines from the left edge of the image processing area.

In accordance with the above method, the register marks can be exactly recognized separately from a print image, even if the print image exists in the left-hand side of the image processing area including the right register mark, and in the right-hand side of the image processing area including the left register mark, since the register marks are not recognized based upon the sum of the all the pixel lines unlikely to the conventional method.

According to another aspect of the present invention, there is provided a printing plate processing apparatus for detecting the locations of right and left register marks respectively burned onto right and left-hand side portions of a printing plate based upon image data of images respectively captured in an image processing area with right and left vertical edges respectively extending in the Y-direction and upper and lower horizontal edges extending in the X-direction. The apparatus includes a camera for capturing images of the right and left register marks through the image processing area; an image processing means for converting the images of the right and left register marks into respective binary image data; a center coordinate detecting means for detecting the center coordinates in the X- and Y-directions of each of the right and left register marks based upon the respective binary image data within the image processing area; and a control means for controlling the center coordinate detecting means in such a manner as to detect the center coordinate in the X-direction of the right register mark based upon the image data obtained from substantially the entire portion of the image data processing area; detecting the center coordinate in the Y-direction of the left register mark based upon the image data obtained from a right-hand side portion of the image data processing area extending up to at least the center coordinate in the X-direction of the right register mark; detecting the center coordinate in the X-direction of the left register mark based upon the image data obtained from substantially the entire portion of the image data processing area; and detecting the center coordinate in the Y-direction of the left register mark based upon the image data obtained from a left-hand side portion of the image data processing area extending up to at least the center coordinate in the X-direction of the left register mark.

With the above method, the center coordinate of each of the register marks can be exactly detected, even if a print image is located in a right-hand side portion of the left register mark, or in a left-hand side portion of the right register mark.

The above apparatus of the present invention may further includes a comparator for determining if the right register mark is white or black by using a white level of the first several pixel lines from the right edge of the image processing area, and if the left register mark is white or black by using the white level of the first several pixel lines from the left edge of the image processing area.

Accordingly, the register marks can be exactly recognized separately from a print image, even if the print image exists in the left-hand side of the image processing area including the right register mark, and in the right-hand side of the image processing area including the left register mark, since the register marks are not recognized based upon the sum of the all the pixel lines unlikely to the conventional method.

BRIEF DESCRIPTION OF THE DRAWINGS

The above, and other objects, features and advantages of the present invention will become apparent from the detailed description thereof in conjunction with the accompanying drawings wherein.

DETAILED DESCRIPTION OF THE PREFERRED EMBODIMENT

An embodiment according to the present invention will be hereinafter described with reference to the accompanying drawings.

Figure 1:
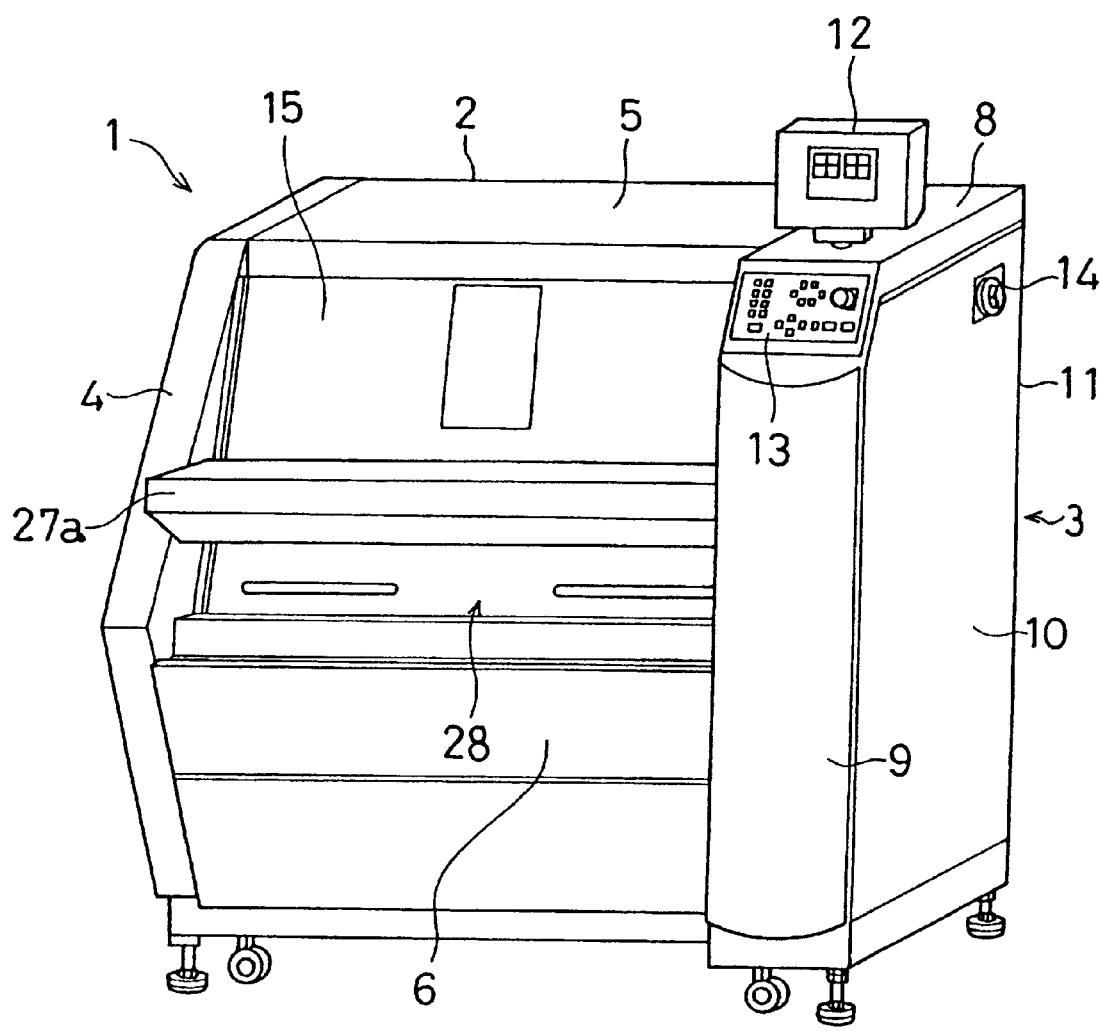
FIG. 1 is a perspective view of a printing plate processing apparatus in accordance with an embodiment of the present invention.
Figure 2:
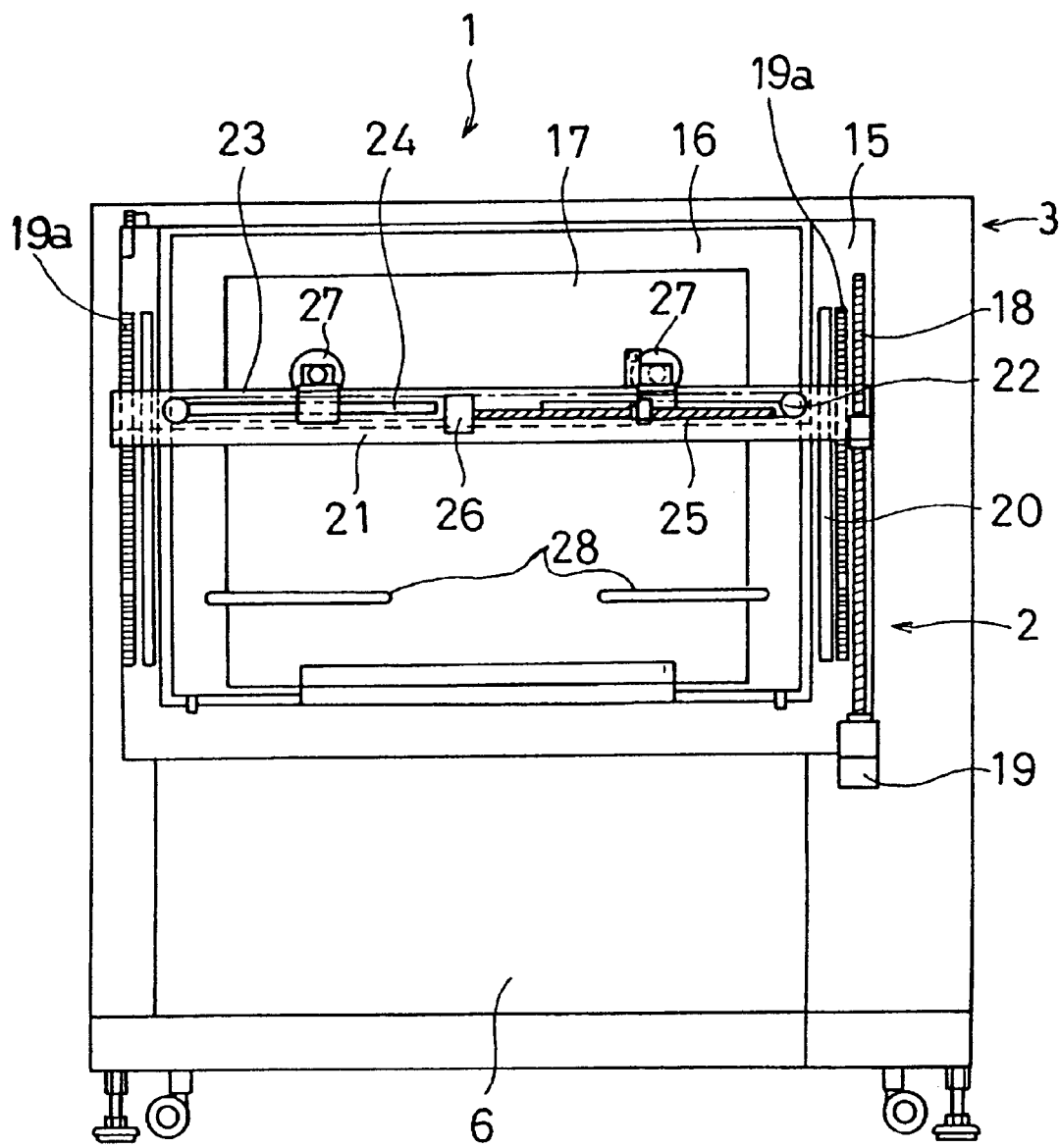
FIG. 2 shows working parts of the printing plate processing apparatus of FIG. 1.
Figure 3:
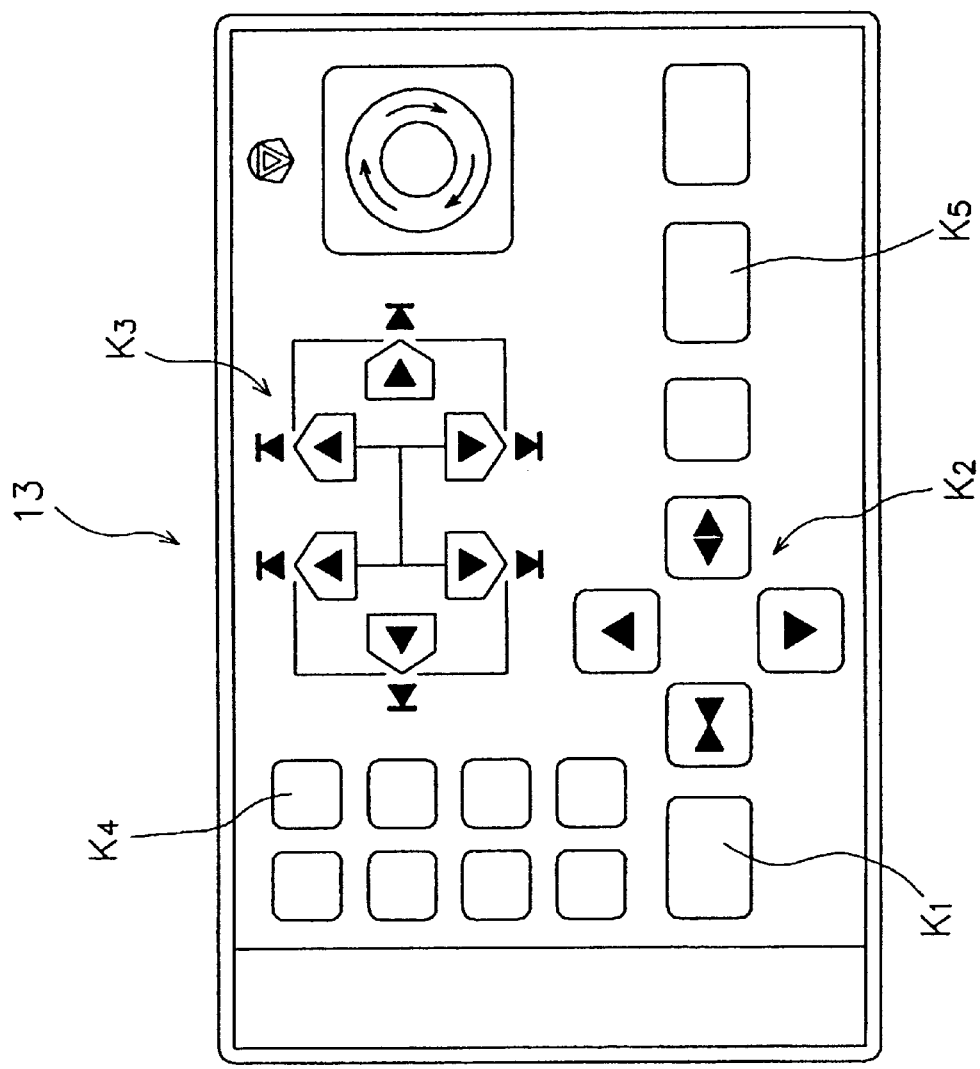
FIG. 3 is an enlarged view of an operation panel of the apparatus of FIG. 1.

Referring to FIGS. 1 to 3, a printing plate processing apparatus 1 includes a printing plate measuring unit 2, an operation unit 3 interconnected to a right opening of the measuring unit 2, a left side plate 4 and an upper plate 5 respectively attached to opening portions formed on a left side and an upper side of the apparatus 1, and a front door 6 openably and closably attached to a lower side of a front opening portion of the apparatus 1.

The operation unit 3 has upper, front and right sides with plates 8, 9 and 10 respectively attached thereon. A rear plate 11 is attached on rear sides of the measuring unit 2 and the operation unit 3. A monitor 12 is attached on a front side of the plate 8 to display images of register marks, etc., captured by a movable camera (to be described later), and messages. An operation panel 13 is provided on an upper portion of the plate 9, and provided with a start key $K_1$, camera positioning keys $K_2$, printing plate positioning keys $K_3$, mode setting keys $K_4$ for setting an image processing accuracy, etc., an image processing key $K_5$ for detecting the center coordinate of a register mark, and other keys. A power switch 14 is provided at an upper and rear side of the plate 10.

The printing plate measuring unit 2 will be described in detail with reference to FIG. 2. A frame 15 is disposed on an upper side of a front opening formed in the measuring unit 2. Movably supported on the frame 15 is a mounting plate 16, which forms suction holes (not shown) therein to suck a printing plate 17 mounted on the mounting plate 16, thereby preventing the printing plate from moving upward from the surface of the plate 16.

The measuring unit 2 further includes a Y-axis ball screw 18 supported on the frame 15 in such a manner as to extend in the Y-direction and connected at its lower end to a Y-axis motor 19 to rotate the ball screw 18, Y-axis synchronous racks 19a provided on both sides of the frame 15, Y-axis linear guides 20 respectively disposed on inner sides of the synchronous racks 19a. A Y-axis synchronous shaft 21 is movably supported on both Y-axis synchronous racks 19a and both Y-axis linear guides 20 in such a manner as to be vertically movable along the Y-axis linear guides 20 upon the rotation of the Y-axis ball screw 18 driven by the Y-axis motor 19.

Disposed inside of the Y-axis synchronous shaft 21 at both sides of the shaft 21 are pulleys 22, around which a steel belt 23 is wound. An X-axis motor 26 is disposed substantially at a horizontal center of the Y-axis synchronous shaft 21. Right and left X-axis linear guides 24 are disposed in an inner side of the steel belt 23 with the X-axis motor 26 between the X-axis linear guides 24. An X-axis ball screw 25 is operatively connected to the X-axis motor 26 and extends under the right X-axis linear guide 24. CCD Monochrome cameras (referred hereinafter as movable cameras) 27 are supported on the steel belt 23 in such a manner as to be movable along the linear guides 24. Specifically, one of the cameras 27 at the left side is movably supported on the steel belt 23 and the left X-axis linear guide 24, while another camera 27 at the right side is threadably engaged with the X-axis ball screw 25 to be movable along the right X-axis linear guide 24. Both movable cameras 27 are moved towards each other or away from each other along the X-axis linear guides 24 in accordance with the rotational direction of the X-axis ball screw 25 through the steel belt 23. Front sides of these movable cameras are covered by a camera cover 27a, as illustrated in FIG. 1. A centering device 28 is disposed at a lower side of the front opening of the measuring unit 2 for centering the printing plate 17 which may be laterally displaced when mounted on the mounting plate 16.

Figure 4:
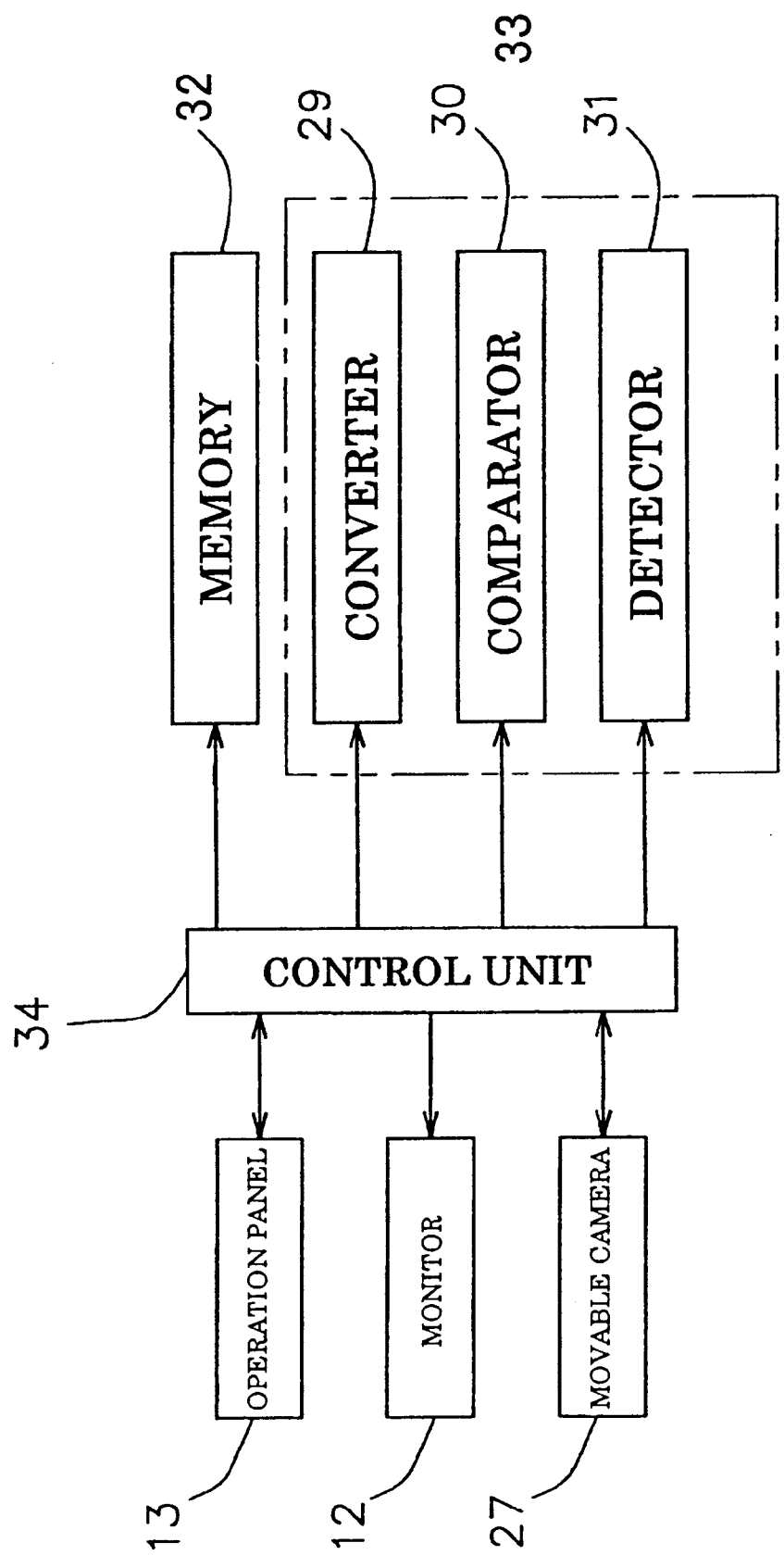
FIG. 4 is a block diagram showing elements of the apparatus.

Elements of the apparatus 1 will be described with reference to a block diagram as illustrated in FIG. 4. An image-processing unit 33 calculates the gray level histogram, the maximum, minimum and average values of the white level, the difference between the maximum value and the average value, the difference between the minimum value and the average value of the white level, and the slice level. Specifically, the image-processing unit 33 includes a converter 29 for converting the gray level histogram calculated from the binary image data of the register mark to the gray level histogram curve, a comparator 30 for comparing the difference between the average value and the maximum value of the white level with the difference between the average value and the minimum value of the white level to determine whether the register mark is white or black, a detector 31 for detecting the intersecting point of the histogram curve of the gray level histogram and the slice level to detect the center coordinates of the X-direction and Y-direction of the register mark, and a memory 32 for storing the data obtained through the converter 29, comparator 30 and the detector 31. A control unit 34 controls the elements 29 to 31 of the image-processing unit 33.

Now, the operational steps of the apparatus 1 will be described. The printing plate 17 is mounted on the mounting plate 16, and is sucked through the suction holes (not shown) formed in the mounting plate 16 by operating a vacuum chamber (not shown) or the like. The start key $K_1$ on the operation panel 13 is switched on to actuate the centering device 28 for centering the printing plate 17. The camera positioning keys $K_2$ are then selectively pushed to move the Y-axis synchronous shaft 21 with the movable cameras 27 thereon along the Y-axis linear guide 20 in the vertical direction by actuating the Y-axis motor 19 and rotating the Y-axis ball screw 18, and move the movable cameras 27 in the horizontal direction along the X-linear guides 24 through the steel belt 23 by actuating the X-axis motor 26 and rotating the X-axis ball screw 18, so that the register marks on the printing plate 17 are positioned within the respective image processing areas of the movable cameras 27. The image processing key $K_5$ is then switched on to process the image, specifically to detect the center coordinates of the register marks.

Figure 6A:
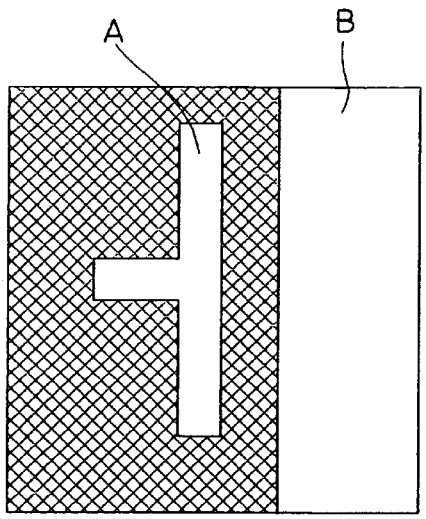
FIG. 6A is a binary image data representing the image of a white register mark in a black background captured by a movable camera of FIG. 1.
Figure 7A:
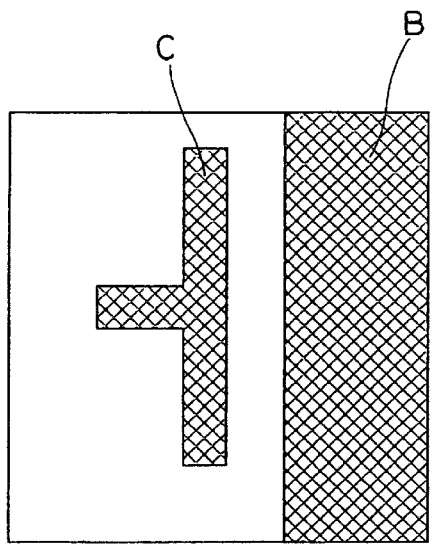
FIG. 7A is a binary image data representing the image of a black register mark in a white background captured by a movable camera of FIG. 1.

Now, the steps of detecting the center coordinate of each register mark will be described by taking for example the case where a register mark A and a printing image B, and a register mark C and the printing image B exist within an image processing area, as illustrated in FIGS. 6A and 7A.

To detect the location of each register mark for the above case, the following conditions should be met:

1. An essential portion of the register mark is substantially equal in shape to a cruciform configuration.
2. The register mark has a negligible inclination with regard to the scanning direction.
3. The register mark has optical characteristics, enabling the register mark to be adequately captured within the image processing area of a corresponding movable camera 27.
4. Any contamination, patterns or other foreign matters with high contract, which may confuse image recognition of the register mark, do not exist around the register mark.
5. The printing image is not scanned prior to the scanning of the register mark.

As a first step, the center coordinate in the X-direction of the register mark is determined. For the register mark A, having the cruciform configuration and more specifically a T-configuration with a vertical line and a horizontal line, both crossing each other, at the left-hand side of the printing plate, the print image B is displayed together with the register mark A within the image processing area, in which the horizontal line of the register mark is positioned to the opposite side of the printing image B with the vertical line therebetween, as illustrated in FIG. 6A. Based upon the binary image data of this register mark A, a corner of a left edge and lower edge, that is, a corner in proximity with a corner 17 among four corners of the printing plate within the image processing area, is selected as the origin (0, 0), and the abscissa axis and the ordinate axis are respectively selected as X-axis and Y-axis. The binary image data of the register mark are scanned in the Y-direction for each pixel line with each pixel at a point (Y=0) as a starting point for the scan of each pixel line. The gray level histogram (white level) of the respective pixels in each scanning line is then calculated ($S_{01}$). Based upon the result of the calculation, a graph is made with the vertical axis representing the white level and the horizontal axis representing the X-axis ($S_{02}$) to obtain a histogram curve, as illustrated in FIG. 6B.

Figure 6B:
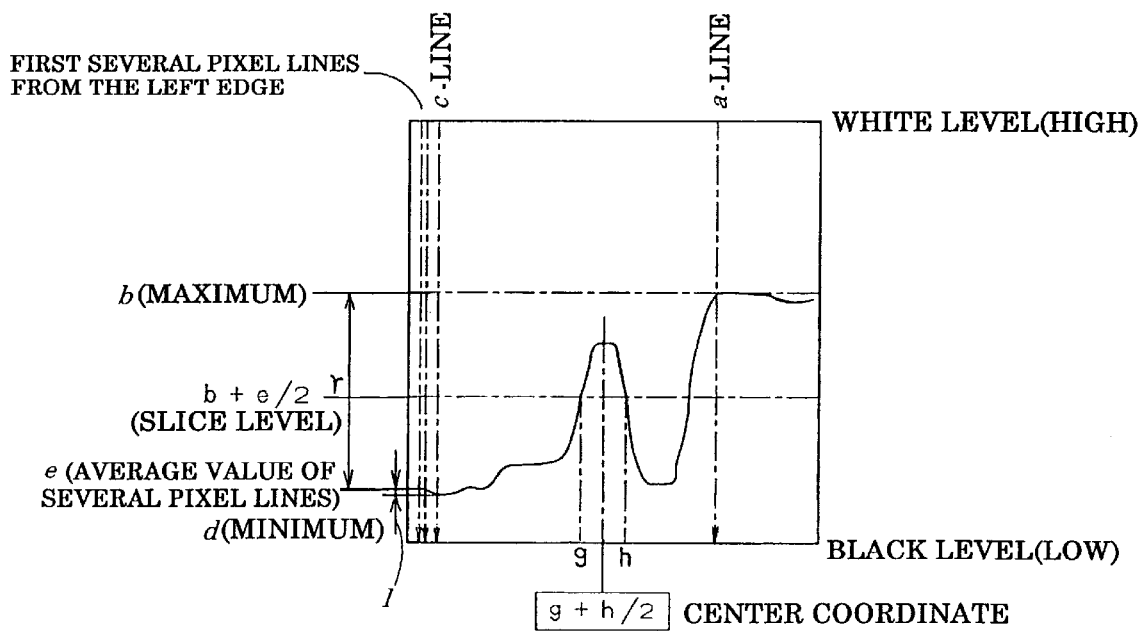
FIG. 6B is a histogram curve obtained through the scanning of the binary image data of FIG. 6A and the calculation of a gray level histogram for each pixel in each scanning line.

In FIG. 6B, a, b, c and d respectively represent the vertical line showing the maximum value of the white level, the maximum value of the white level, the vertical line showing the minimum value of the white level and the minimum value of the white level. The white level of several pixel lines, for example, the first four pixel lines from the left edge of the image processing area are then counted up to calculate the average value e ($S_{03}$).

The difference r between the maximum value b and the average value e is compared with the difference l between the minimum value d and the average value e to determine which difference is larger than the other ($S_{04}$). When l<r, it represents a white register mark in a black background ($S_{05}$). When l>r, it represents a black register mark in a white background ($S_{06}$).

In case of r>l, i.e., the white register mark A in the black background as illustrated in FIG. 6B, the slice level is obtained by the formula: (Maximum value b+Average value e)/2, and the comparison between the sum of the white level for each scanning line and the slice level proceeds in the positive direction along the X-axis with X=0 as a starting line to detect a g-line at which the sum of the white level of one scanning line firstly becomes the same level as the slice level, and an h-line at which the sum of the white level of one scanning line secondly becomes the same level as the slice level ($S_{07}$). The center coordinate in the X-direction of the register mark is then determined by the formula: (g+h)/2 ($S_{08}$).

When the g- and h-lines cannot be detected, it is regarded as being incapable to detect ($S_{09}$), and such a fact is informed to an operator by an alarm or the like ($S_{10}$).

Figure 5:
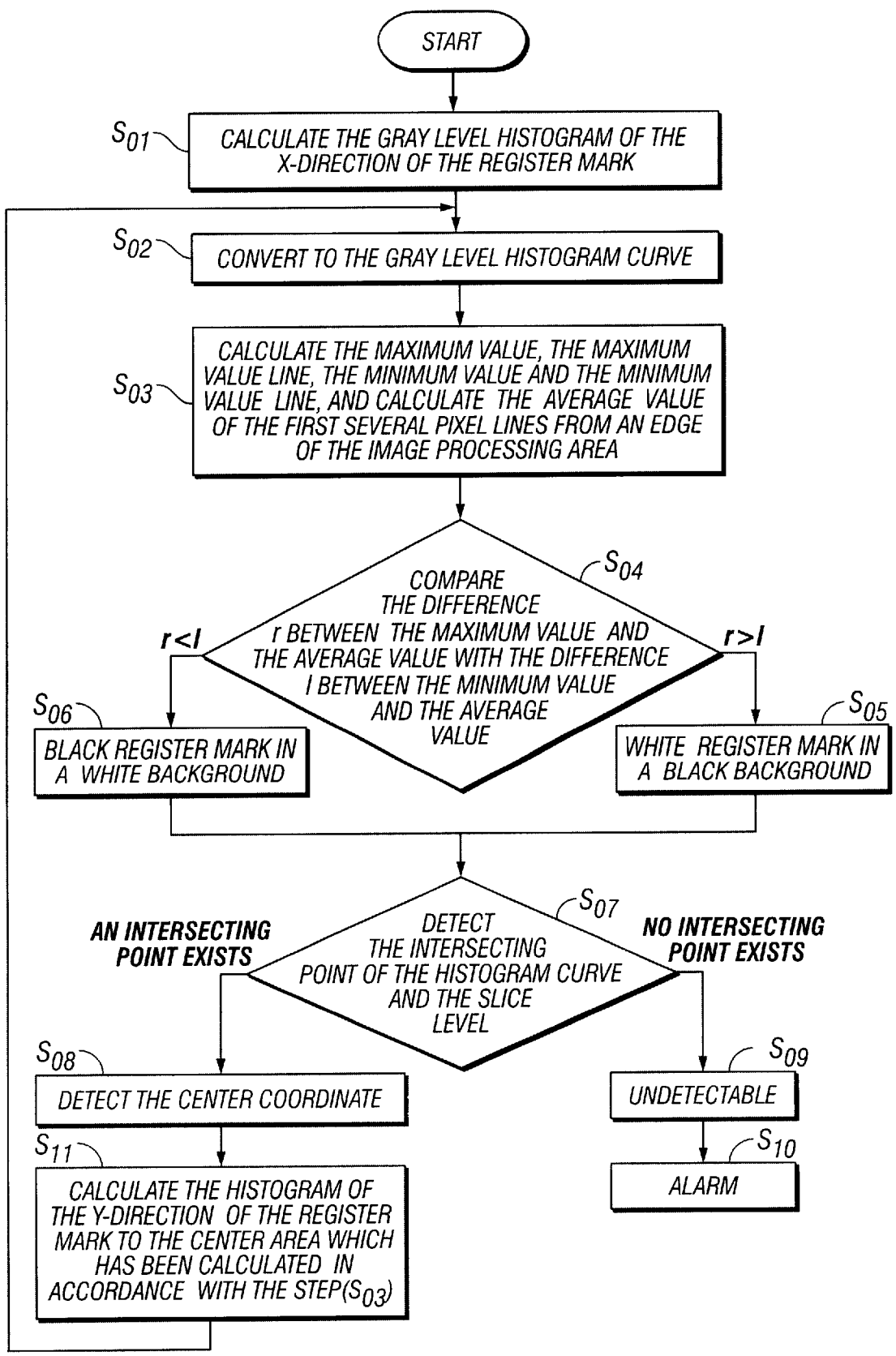
FIG. 5 is a flow chart showing the steps of detecting the location of a register mark in the printing plate processing apparatus of FIG. 1.
Figure 8:
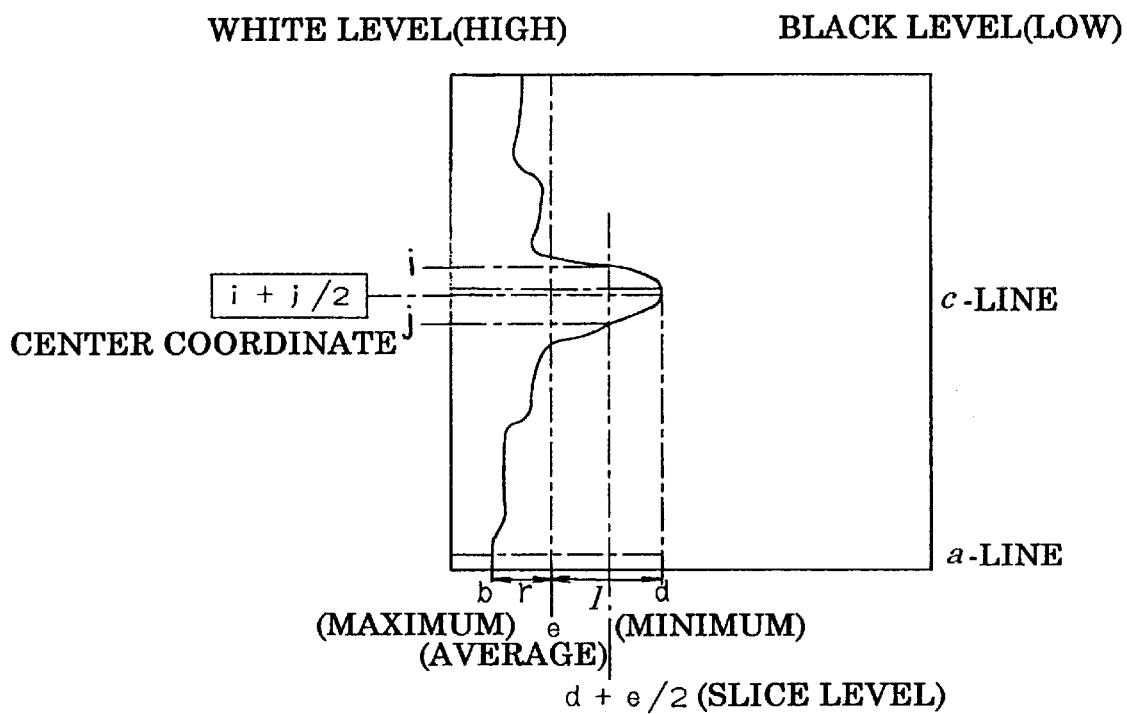
FIG. 8 is another histogram curve obtained through the scanning of the binary image data of FIG. 6A and the calculation of a gray level histogram for each pixel in each scanning line.
Figure 9:
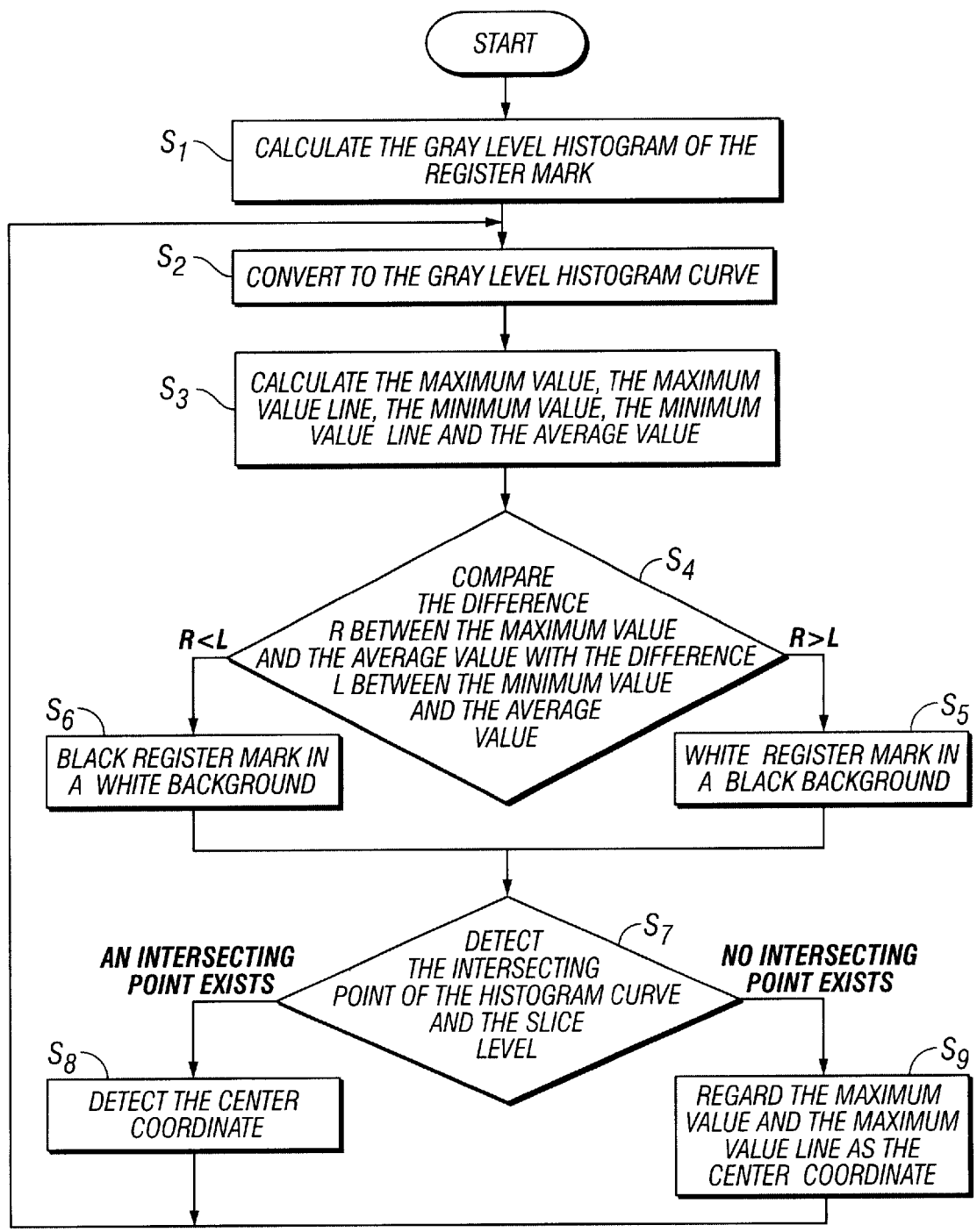
FIG. 9 is a flow chart showing the steps of detecting the location of the register mark in a conventional manner.
Figure 10A:
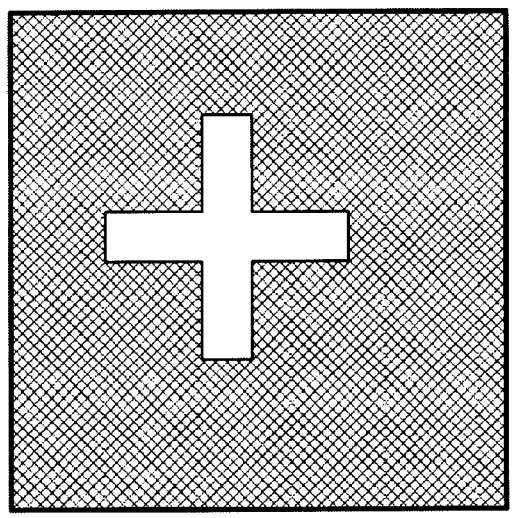
FIG. 10A illustrates a binary image data representing a white register mark in a black background.
Figure 10B:
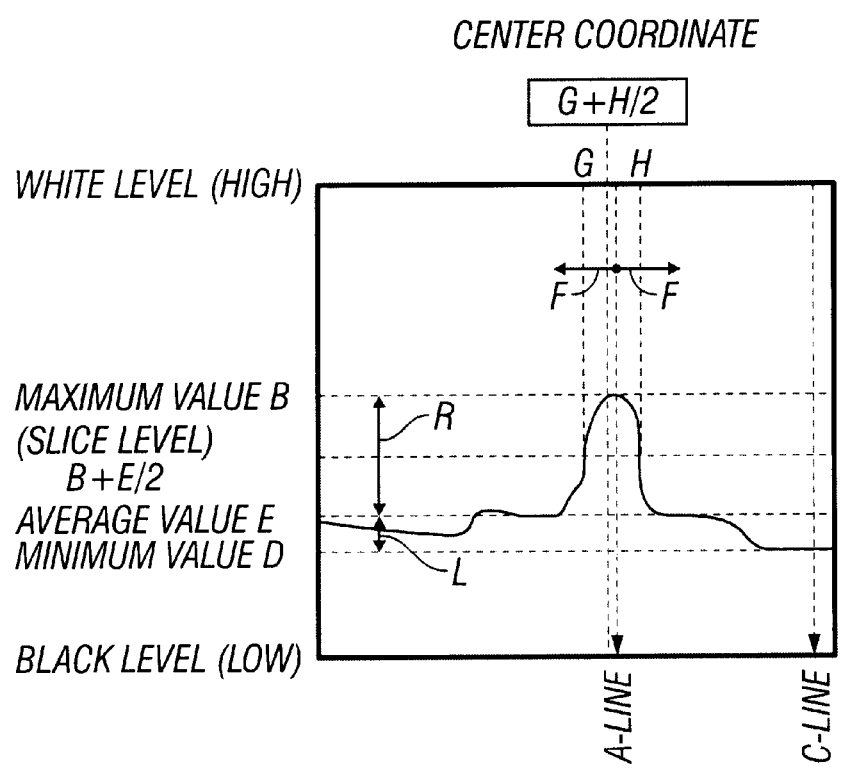
FIG. 10B illustrates a histogram curve obtained through the scanning of the binary image data of FIG. 10A and the calculation of a gray level histogram for each pixel in each scanning line.
Figure 11A:
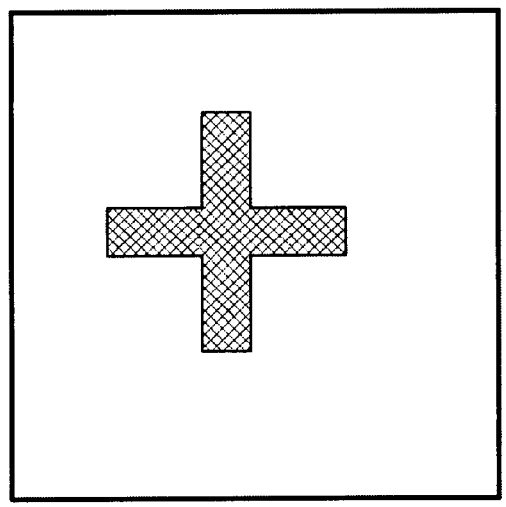
FIG. 11A illustrates a binary image data representing a black register mark in a white background.
Figure 11B:
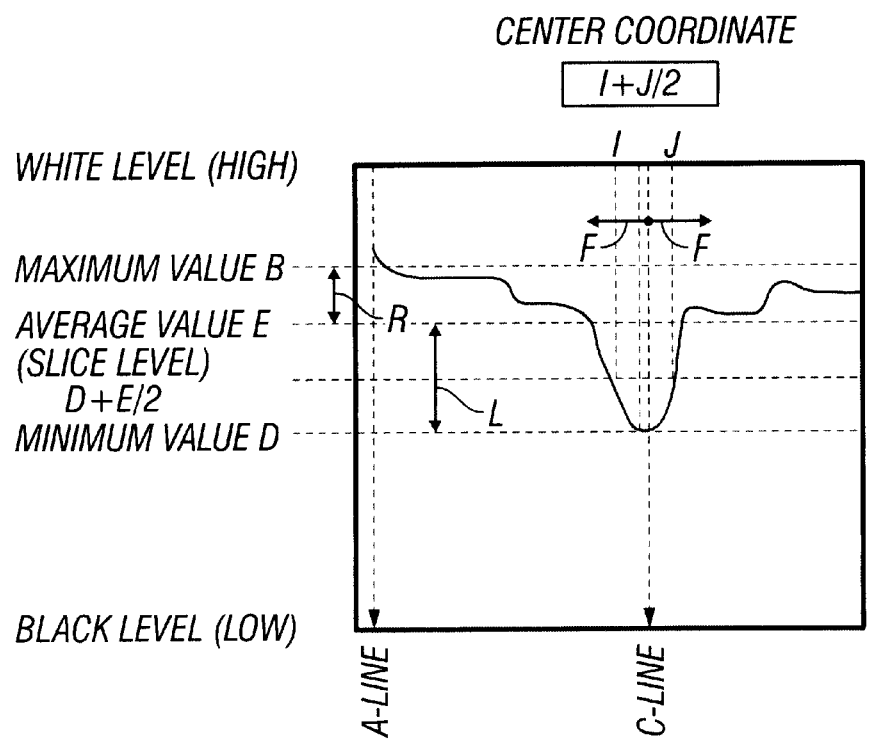
FIG. 11B illustrates a histogram curve obtained through the scanning of the binary image data of FIG. 11A and the calculation of a gray level histogram for each pixel in each scanning line.

To detect the center coordinate in the Y-direction of the white register mark A, the binary image data of the register mark are scanned in the X-direction for each pixel line with each pixel at a point (X=0) as a starting point for the scan of each pixel line and the corner of the left edge and the lower edge as the origin (0, 0), as following the steps in the same manner as those in the flow chart of FIG. 5. This method is substantially the same as the conventional method, except that the scanning is not continued to the right edge of the image processing area, but is only done to the center coordinate in the X-direction obtained in accordance with the above flow ($S_{11}$). The histogram curve is then obtained based upon the binary image data of the register mark obtained through this scanning method, as illustrated in FIG. 8. Thus, the center coordinate in the Y-direction is determined through the flow as illustrated in FIG. 9. In this regard, since the right-hand side portion of the image processing area needs not to be calculated, the processing time can be shortened, and the calculation can be more exactly made even if the print image is placed within the image processing area.

Figure 7B:
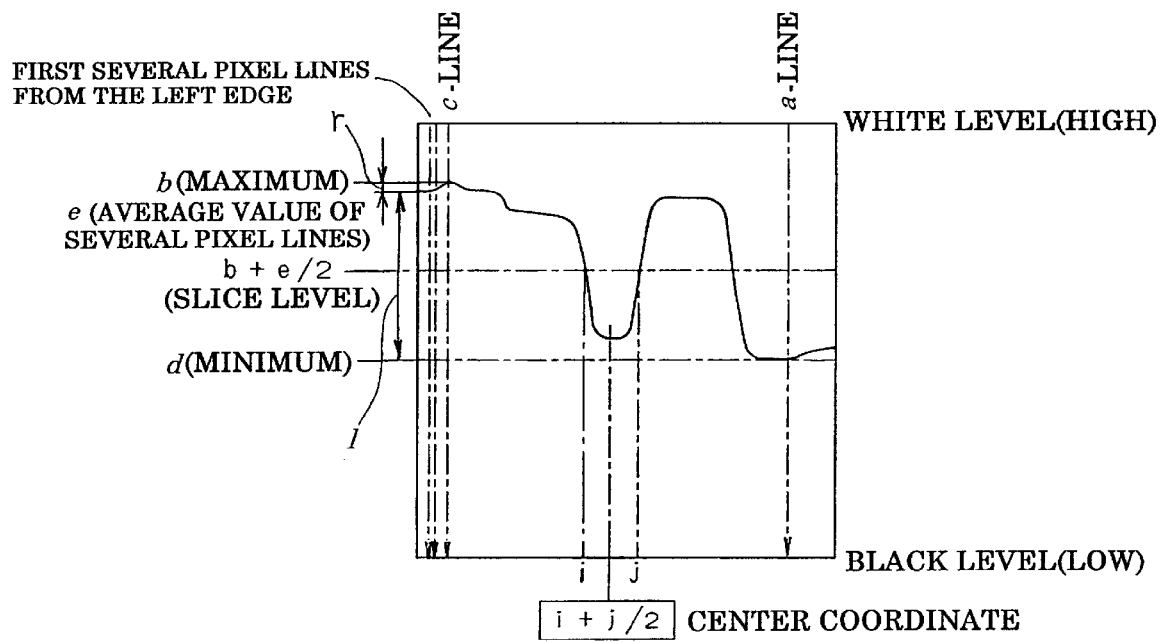
FIG. 7B is a histogram curve obtained through the scanning of the binary image data of FIG. 7A and the calculation of a gray level histogram for each pixel in each scanning line.

In case of r<l, i.e., the black register mark C in the white background, as illustrated in FIG. 7A, the slice level is obtained by the formula: (Minimum value d+Average value e)/2, and the comparison between the sum of the white level for each scanning line and the slice level proceeds in the positive direction along the X-axis with X=0 as a starting point to detect the i-line at which the sum of the white level of one scanning line firstly becomes the same level as the slice level, and the j-line at which the sum of the white level of one scanning line secondly becomes the same level as the slice level ($S_{07}$). The center coordinate in the X-direction of the register mark is then determined by the formula: (i+j)/2 ($S_{08}$), as illustrated in FIG. 7B.

When the i- and j-lines cannot be detected, it is regarded as being incapable to detect ($S_{09}$), and such a fact is informed to an operator by an alarm or the like ($S_{10}$).

Then, to detect the center coordinate in the Y-direction of the black register mark C, the center coordinate is detected according to the steps ($S_{01}$) to ($S_{09}$) of the flow as illustrated in FIG. 5, in the same manner as the white register mark.

In accordance with the method of detecting the locations of the register marks, the center coordinate in the Y-direction of the register mark burned onto the right-hand side of the printing plate is detected based upon the binary image data obtained from a right-hand side portion of the image processing area extending up to at least the center coordinate in the X-direction of the register mark. In this regard, since the left-hand side portion of the image processing area needs not to be calculated, the processing time can be shortened, and the calculation can be more exactly made.

Since the image captured by the movable camera 27 of the right-hand side of the printing plate 16 is substantially symmetrical to that of the movable camera 27 of the left-hand side, the aforesaid description applies equally to the image processing area of the movable camera 27 of the right-hand side. Accordingly, when the location of the right register mark is detected, it will be appreciated that a corner, at which the right edge of the image processing area crosses the lower edge thereof, is selected as the origin (0, 0) of the image processing area, that the binary image data of the register mark of the right-hand side are therefore scanned in the Y-direction from the right edge to the left edge of the image processing area, and that the first several pixel lines from the right edge of the image processing area are selected to obtain the average value e.

This specification is by no means intended to restrict the present invention to the preferred embodiments set forth therein. Various modifications to the printing plate processing apparatus and method of detecting the location of a register mark on a printing plate, as described herein, may be made by those skilled in the art without departing from the spirit and scope of the present invention as defined in the appended claims.

What is claimed is:

1. A method of detecting the locations of right and left register marks respectively burned onto right- and left-hand side portions of a printing plate based upon image data of images respectively captured within an image processing area with right and left vertical edges respectively extending in the Y-direction, and upper and lower horizontal edges extending in the X-direction, which comprises:

detecting the center coordinate in the X-direction of said right register mark based upon the image data obtained from substantially the entire portion of said image data processing area;

detecting the center coordinate in the Y-direction of said right register mark based upon the image data obtained from a right-hand side portion of said image data processing area extending up to at least the center coordinate in the X-direction of said right register mark;

detecting the center coordinate in the X-direction of said left register mark based upon the image data obtained from substantially the entire portion of said image data processing area; and detecting the center coordinate in the Y-direction of said left register mark based upon the image data obtained from a left-hand side portion of said image data processing area extending up to at least the center coordinate in the X-direction of said left register mark.

2. The method of detecting the locations of left and right register marks according to claim 1, wherein a white level of a set of several pixel lines from said right edge of the image processing area is used to determine if said right register mark is white or black, and the white level of a set of several pixel lines from said left edge of the image processing area is used to determine if said left register mark is white or black.

3. A printing plate processing apparatus for detecting the locations of right and left register marks respectively burned onto right- and left-hand side portions of a printing plate based upon image data of images respectively captured in an image processing area with right and left vertical edges respectively extending in the Y-direction and upper and lower horizontal edges extending in the X-direction, which comprises:

a camera for capturing images of said right and left register marks through said image processing area;

an image processing means for converting the images of the said right and left register marks into respective binary image data;

a center coordinate detecting means for detecting the center coordinates in the X- and Y-directions of each of said right and left register marks based upon said respective binary image data within said image processing area; and a control means for controlling said center coordinate detecting means in such a manner as to detect the center coordinate in the X-direction of said right register mark based upon the image data obtained from substantially the entire portion of said image data processing area; detecting the center coordinate in the Y-direction of said right register mark based upon the image data obtained from a right-hand side portion of said image data processing area extending up to at least the center coordinate in the X-direction of said right register mark; detecting the center coordinate in the X-direction of said left register mark based upon the image data obtained from substantially the entire portion of said image data processing area; and detecting the center coordinate in the Y-direction of said left register mark based upon the image data obtained from a left-hand side portion of said image data processing area extending up to at least the center coordinate in the X-direction of said left register mark.

4. A printing plate processing apparatus according to claim 3 further comprising a comparitor for determining if said right register mark is white or black by using a white level of a set of several pixel lines from said right edge of the image processing area, and if said left register mark is white or black by using the white level of a set of several pixel lines from said left edge of the image processing area.

* * * * *